(12) United States Patent
Chu et al.

(10) Patent No.: US 7,561,223 B2
(45) Date of Patent: Jul. 14, 2009

(54) DEVICE AND METHOD FOR PROTECTING GATE TERMINAL AND LEAD

(75) Inventors: Hung-Jen Chu, Nantou (TW); Hui-Chung Shen, Tainan (TW)

(73) Assignee: Chungwha Picture Tubes, Ltd., Taipei (TW)

( * ) Notice: Subject to any disclaimer, the term of this patent is extended or adjusted under 35 U.S.C. 154(b) by 115 days.

(21) Appl. No.: 11/078,245

(22) Filed: Mar. 9, 2005

(65) Prior Publication Data

US 2005/0156247 A1  Jul. 21, 2005

Related U.S. Application Data

(62) Division of application No. 10/642,417, filed on Aug. 15, 2003, now abandoned.

(51) Int. Cl.
*G02F 1/1333* (2006.01)
(52) U.S. Cl. ........................................................ 349/56
(58) Field of Classification Search ................ 438/465; 349/56
See application file for complete search history.

(56) References Cited

U.S. PATENT DOCUMENTS

| | | | |
|---|---|---|---|
| 4,364,078 A | 12/1982 | Smith et al. | |
| 4,835,592 A | 5/1989 | Zommer | |
| 5,414,297 A | 5/1995 | Morita et al. | |
| 5,763,936 A * | 6/1998 | Yamaha et al. | 257/644 |
| 6,356,330 B1 * | 3/2002 | Ando et al. | 349/141 |
| 6,521,975 B1 | 2/2003 | West et al. | |
| 6,734,049 B2 * | 5/2004 | Yoo et al. | 438/151 |
| 6,734,090 B2 * | 5/2004 | Agarwala et al. | 438/598 |
| 6,750,932 B2 * | 6/2004 | Kim | 349/114 |
| 6,762,081 B2 * | 7/2004 | Yamazaki et al. | 438/150 |
| 6,787,930 B1 | 9/2004 | Nakata et al. | |
| 6,797,535 B2 * | 9/2004 | Tanabe | 438/48 |
| 7,050,131 B2 * | 5/2006 | Choi et al. | 349/110 |
| 7,176,535 B2 * | 2/2007 | Chae | 257/390 |
| 2001/0050747 A1 * | 12/2001 | Hoshino et al. | 349/149 |

* cited by examiner

*Primary Examiner*—Sue Purvis
*Assistant Examiner*—W. Wendy Kuo
(74) *Attorney, Agent, or Firm*—Perkins Coie LLP

(57) ABSTRACT

A resist region covering the gate terminal and lead and between a passivation layer and a gate insulating layer is used to protect the gate terminal and lead. The resist region is located at a scribing line on margin of the color filter substrate of a panel, thereby the resist region can protect the passivation layer and the gate insulating layer from cracking, and the gate terminal and the lead from corrosion after a portion of the color filter substrate is removed along the scribing line.

12 Claims, 2 Drawing Sheets

DEVICE AND METHOD FOR PROTECTING GATE TERMINAL AND LEAD

CROSS-REFERENCE TO RELATED APPLICATION

This application is a divisional of U.S. patent application Ser. No. 10/642,417, filed Aug. 15, 2003, which is hereby incorporated by reference in its entirety.

BACKGROUND

1. Field of the Invention

The present invention generally relates to a device and method for protecting gate terminal and lead, and more particularly to a device and method for protecting gate terminal and lead at stage of scribing and spalling.

2. Description of the Prior Art

In fabrication of a thin film transistor (TFT) liquid crystal display (LCD) device, an array substrate and a color filter substrate are provided respectively, in which a thin film transistor array on the array substrate are formed by thin film deposition, lithographic process, and etching step of semiconductor process. Having been formed the two substrates, an assembling process, a scribing step, and a spalling step is performed. The scribing and spalling steps are to remove peripheral regions on the color filter substrate such that contact plugs of gate terminals on the array substrate can be exposed.

The scribing and spalling steps can be shown in FIG. 1, wherein a display region on an array substrate 100 includes a thin film transistor and a peripheral region includes a gate line 102a. The thin film transistor, covered and protected by a passivation layer 112, has a gate 102, gate insulating layer 104, island semiconductor layer 106, and source/drain 108. A contact plug 114 on gate terminal of the gate line 102a is used to connect driver IC electrically. Another substrate 130, which is also called color filter substrate, has a black matrix 132 on the inner side and assembled with the array substrate 100. In the TFT-LCD fabricating process, after the two substrates are assembled, the scribing and spalling steps are performed. In FIG. 1, scribing line is denoted by dash line, and the contact plug 114 is exposed after scribing.

However, material of the gate insulating layer 104 and the passivation layer 112 is silicon nitride, which has less strain at the stage of scribing and spalling steps to break the two layers. Further, after the gate insulating layer 104 and the passivation layer 112 are broken, gas or origin of pollution will reach the gate line 102a along splits which cause corrosion or oxidation of the gate terminal of gate line 102a. This will cause the display panel fail. Therefore, a solution for resolving issues caused at the scribing and spalling steps is necessary.

SUMMARY

In accordance with the present invention, a resist region between the passivation and the gate insulating layer on the array substrate is provided. When the panel is scribed and spalled, the resist region can provide sufficient strain to protect the gate insulating layer and passivation layer from breaking.

It is another object of this invention to provide a less active resist region compared to the gate terminal and lead of gate line to prevent gate line from corrosion.

It is a further object of this invention to have a floating resist region such that there is no electrical connection between the resist region and any circuit of the display panel.

It is still another object of this invention that formation of the resist region can be combined to the present TFT fabrication process without increasing TFT fabrication cycle time.

In one embodiment, a device for protecting a gate terminal and lead at stage of scribing and spalling a LCD panel is provided, wherein the LCD panel comprises a first substrate with thin film transistor array thereon and a second substrate thereon within color filter opposite to the thin film transistor array. The device comprises a resist region covering the gate terminal and lead of the gate electrode line and between a passivation layer and a gate insulating layer, and located at a scribing line on margin of the second substrate of the panel, thereby the resist region can protect the passivation layer, and the gate insulating layer from cracking, the gate terminal and lead from corrosion after a portion of the second substrate is removed along the scribing line.

A method for protecting a gate terminal and lead at stage of scribing and spalling a LCD panel is also provided. The method comprises steps of forming the gate electrode and the gate line on a first substrate, wherein the first substrate is also called array substrate or lower substrate. Then, a gate insulating layer is deposited on the gate electrode, the gate line, and the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
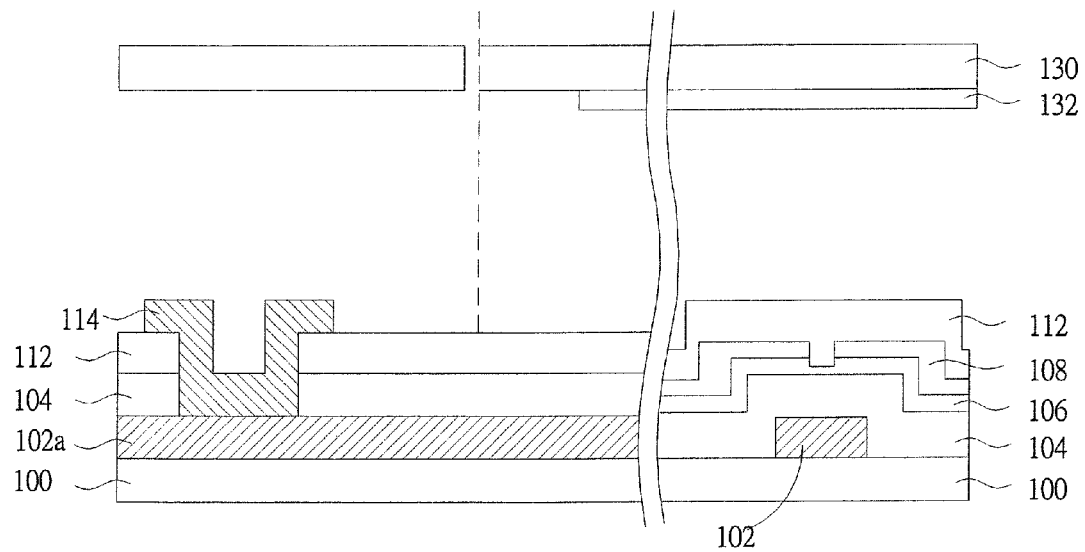
FIG. 1 illustrates a schematic representation of an LCD panel at the stage of scribing and spalling by using conventional method wherein passivation layer, gate insulating layer, gate terminal as well as lead of gate line on array substrate may be damaged.

Some sample embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

This invention provides a device for protecting a gate terminal and lead at stage of scribing and spalling a LCD panel, wherein the LCD panel comprises a first substrate with thin film transistor array thereon and a second substrate thereon within color filter opposite to the thin film transistor array. The device comprises a resist region covering the gate terminal and lead of gate electrode line and between a passivation layer and a gate insulating layer, and located at a scribing line on margin of the second substrate of the panel, thereby the resist region can protect the passivation layer and the gate insulating layer from cracking, the gate terminal and lead from corrosion after a portion of the second substrate is removed along the scribing line. Material of the resist region is metal and the resist region is floating between the gate insulating layer and the passivation layer. Activity of the resist region is less than the gate electrode line.

Distance between the scribing line and margin of the resist region is about more than 50 μm, and width of the resist region is larger than the gate terminal and the gate electrode line.

Material of the resist region can be the same as source/drain electrodes of the thin film transistor, and step of formation the resist region is at a step of formation of the source/drain electrodes, wherein formation of the resist region comprises steps of providing the first substrate with a gate electrode and the gate electrode line thereon, and the gate insulating layer covering the gate electrode, the gate electrode line, and the array substrate, wherein the first substrate is also called array substrate or lower substrate. Then, an island semiconductor layer is formed on the gate insulating layer and over the gate electrode. Next, a blanket metal layer is deposited on the island semiconductor layer and the gate insulating layer. A lithographic process is then performed to the conductive layer by using a reticle with a source pattern and a drain pattern on the gate electrode and a resist region pattern on the gate terminal and lead. Afterward, the conductive layer is etched to form the source/drain electrodes and the resist region.

Material of the resist region can be the same as island semiconductor layer of the thin film transistor, and step of formation the resist region is at the step of formation of the island semiconductor layer, wherein formation of the resist region comprises steps of providing the first substrate with a gate electrode and the gate electrode line thereon, the gate insulating layer blanket on the gate electrode, the gate electrode line wherein the first substrate is also called array substrate or lower substrate, and the array substrate. Then, a blanket semiconductor layer is deposited on the gate insulating layer. Next, a lithographic process is performed to the semiconductor layer by using a reticle with an island pattern on the gate electrode and a resist region pattern on the gate terminal and the lead. Afterward, the semiconductor layer is etched to form the island semiconductor layer and the resist region.

This invention also provides a method for protecting a gate terminal and lead at stage of scribing and spalling a LCD panel. The method comprises steps of forming the gate electrode and the gate line on a first substrate, wherein the first substrate is also called array substrate or lower substrate. Then, a gate insulating layer is deposited on the gate electrode, the gate line, and the substrate.

Material of the resist region can be the same as source/drain electrodes of the thin film transistor, and step of formation the resist region is at a step of formation of the source/drain electrodes. Formation of the resist region comprises steps of forming an island semiconductor layer on the gate insulating layer and over the gate electrode. Then, a blanket metal layer is deposited on the island semiconductor layer and the gate insulating layer. Next, a lithographic process is performed to the conductive layer by using a reticle with a source pattern and a drain pattern on the gate electrode and a resist region pattern on the gate terminal and the lead. Afterward, the conductive layer is etched to form the source electrode, the drain electrode and the floating metal resist region.

Figure 2:
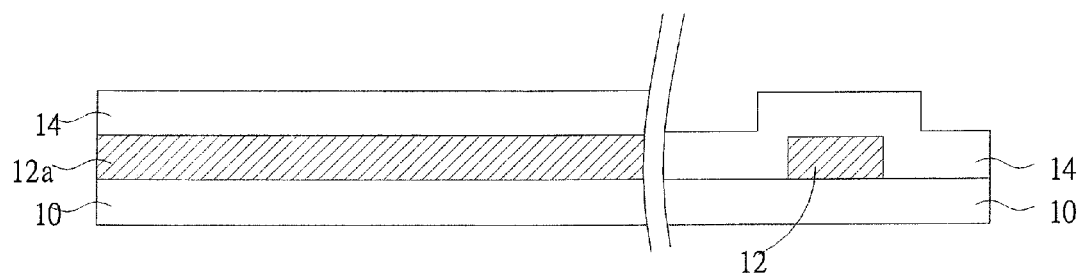
FIG. 2 illustrates a schematic representation of a method in accordance with this invention wherein gate electrode and gate line are formed on an array substrate with a gate insulating layer thereon.

One embodiment is disclosed according to this invention. Referring to FIG. 2, a gate electrode 12 (at right hand side display region) and a gate line 12a (at left hand side display region) are formed on a first substrate 10, and a blanket gate insulating layer 14 is formed on the gate electrode 12, gate line 12a, and first substrate. The first substrate 10 is also called array substrate or lower substrate of LCD panel. When a back light source is used as light source for liquid crystal display device, the first substrate 10 is transparent, such as glass or transparent plastic. When a front light source is used as light source of the display device, the first substrate 10 should not necessary be transparent. Material of the gate electrode layer 12 can be metal or any kind of conductive material, such as aluminum or aluminum alloy, molybdenum or molybdenum tungsten alloy, chromium or tantalum. Formation of the gate electrode layer 12 is to deposit a conductive layer by using sputtering method on the first substrate 10, and lithographic and etching processes are performed to form a gate electrode pattern on a predetermined position. When gate electrode 12 pattern is formed on the first substrate 10, gate line 12a is also formed on the first substrate 10. The gate line 12a is always at one margin of the display panel. The gate line 12a and gate electrode 12 are formed at one step and have the same material.

A blanket insulating layer 14 is formed on the first substrate 10 to cover the gate electrode and the gate line 12a. The insulating layer 14, also called gate insulating layer, material of which is silicon nitride, is a blanket deposited on the gate electrode and the gate line 12a and first substrate 10. The insulating layer 14 serves as the gate dielectric layer of the thin film transistor and provides insulate isolation on the other area. Formation of the insulating layer 14 uses popular chemical vapor deposition method.

Figure 3:
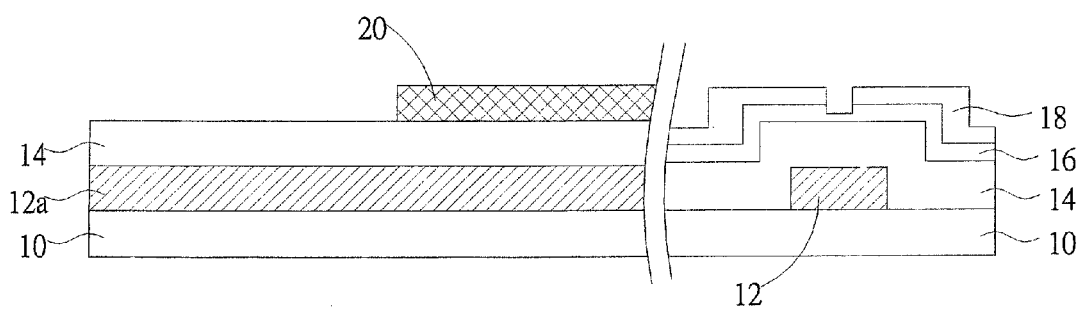
FIG. 3 illustrates a schematic representation of a method in accordance with this invention wherein a thin film transistor is formed on the array substrate and a resist region is formed on the gate insulating layer.

Referring to FIG. 3, a thin film transistor is formed on display region and a resist region 20 is formed on the peripheral region. Formation of the thin film transistor is to form the island semiconductor layer 16 and metal source/drain 18. Material of the resist region 20 may be the same as metal source/drain 18, island semiconductor 16, or a composite layer including both semiconductor layer and metal layer. Position of the resist region 20 is about on scribing line when the display panel is assembled and scribed, in which distance between the scribing line and both ends of the resist region 20 is about more than 50 μm, and width of the resist region is larger than the gate terminal 40 and lead shown in FIG. 4. Impedance of preferred material of the resist region 20 is less than the gate line 12a, because the gate line 12a will be corroded or oxidized after the resist region 20 is completely eroded or oxidized when both the passivation layer 22 and the gate insulating layer 14 are cracked. The smaller impedance of the resist region 20 allows longer duration of the resist region 20 is eroded or oxidized, and possibility of gate line 12a eroding or oxidizing can be decreased. The resist region 20 is floating between the passivation layer 22 and the gate insulating layer 14 and does not connect electrically with other conductivity or semiconductor.

Formation of the resist region 20 can have many ways. One method is to use material of metal source/drain 18 for the resist region 20. The method is to form an island semiconductor layer 16 on the insulating layer 14 and over the gate electrode layer 12. The semiconductor layer 16 primarily provides a channel region of the thin film transistor. In thin film transistor-liquid crystal display device, channel region is above the gate electrode layer 12, and also named back channel region. The semiconductor layer 16 uses a composite layer within double layers, which is underneath amorphous silicon layer and upper n-doped amorphous silicon layer. The underneath amorphous silicon layer provides channel region of the transistor, while the upper n-doped amorphous silicon layer serves as ohmic contact between metal and semiconductor to reduce resistance between metal source/drain and semiconductor layer.

A conductive layer 18, serving as source and drain electrodes, is formed on the island semiconductor layer 16, and a thin film transistor is therefore formed. Materials of this conductive layer 18 can be aluminum or aluminum alloy, molybdenum or molybdenum tungsten alloy, chromium or tantalum. Formation of the source and drain electrodes is to deposit a blanket conductive layer on the island semiconductor layer 16 and the gate insulating layer 14, and then a lithographic process is performed to remove a portion of conductive layer 18 to leave the source and drain electrodes. In this lithographic process, there is a resist pattern on peripheral of the reticle, and the resist region 20 is formed after the following etching step.

Another method is to form the resist region 20 simultaneously when the island semiconductor layer 16 is formed. The method is to form a blanket semiconductor layer on the gate insulating layer 14. Then, a lithographic process and an etching step are performed to form an island semiconductor layer 16 over the gate electrode 12. In this lithographic process, there is a resist pattern on peripheral of the reticle, and the resist region 20 is formed after the etching step.

A further method is to comply with the current 4 lithographic processes, which means formation of the island semiconductor layer and the source/drain utilize one lithographic process. A blanket semiconductor layer and a blanket metal layer are deposited sequentially on the gate insulating layer 14. Then, a lithographic process and an etching step are performed to form an island semiconductor layer 16 over the gate electrode 12 and a metal source/drain 18 thereon. In this lithographic process, there is a resist pattern on peripheral of the reticle, and the resist region 20 is formed after the etching step.

Figure 4:
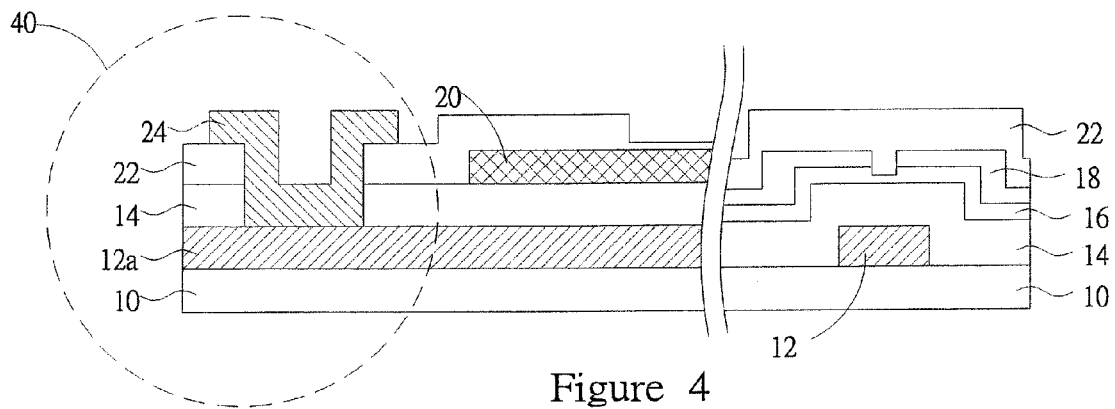
FIG. 4 illustrates a schematic representation of a method in accordance with this invention wherein a passivation layer is formed on the thin film transistor and a contact window is formed on the gate terminal.

Referring to FIG. 4, a blanket passivation layer 22 is formed on the thin film transistor, the resist region 20 and the gate insulating layer 14. The passivation layer 22 can be silicon nitride and formed by chemical vapor deposition method. Then, another lithographic process and an etching step are performed to form contact windows for drain electrode and the terminals on the peripheral of display panel. The contact plug 24 in FIG. 4 uses transparent conductive layer, and formation of the contact plug 24 can be combined to with formation of the transparent conductive electrode. After the passivation layer 22 is formed, the resist region 20 is floating. Moreover, the substrate 10, gate line 12a, gate insulating layer 14, passivation layer 22 and contact plug 24 construct a gate terminal 40, shown as FIGS. 4 and 5.

Figure 5:
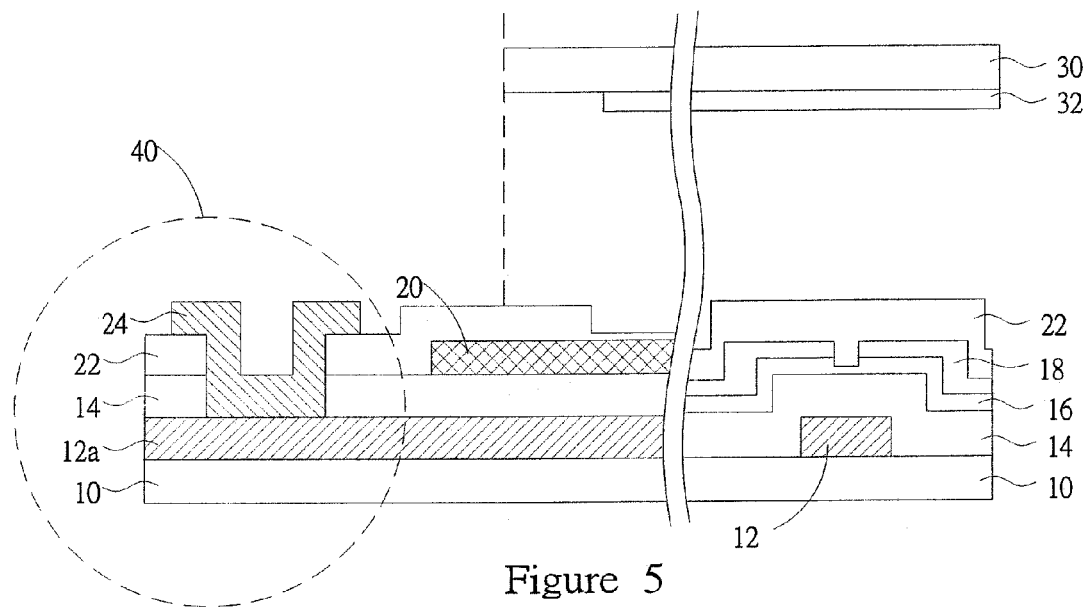
FIG. 5 illustrates a schematic representation of a method in accordance with this invention wherein the resist layer can protect passivation layer, gate insulating layer, and gate terminal as well as lead of gate line on the array substrate at the stage of scribing and spalling.

Referring to FIG. 5, a second substrate 30, which is also called color filter substrate, is assembled to the array substrate 10 and scribed and spalled, wherein the dash line indicates scribing line. Inner side of the color substrate 30 has a black matrix 32 opposite to the array in the figure. When the color filter substrate 30 is cut along the scribing line to remove the peripheral region, the resist region 20 provides sufficient stress for array substrate 10 to protect passivation layer 22 and gate insulating layer 14 from cracking. Even if the passivation layer 22 and gate insulating layer 14 is broken, the eroding or oxidizing rate of the gate line 12a can be postponed due to activity of the resist region 20 is less than the gate line 12a. After the scribing and spalling steps, contact plug 24 on the gate terminal is exposed, and will connect to driver IC on a flexible printed circuit board electrically.

Figure 6:
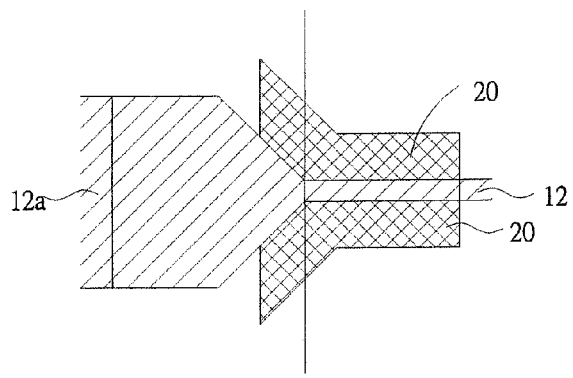
FIG. 6 illustrates a top view of the resist region on the gate terminal and lead in accordance with this invention.

Referring to FIG. 6, a top view of the resist region 20 is shown. Width of the resist region 20 is larger than gate terminal and lead, and distance between the scribing line and both ends of the resist region 20 is about more than 50 µm. Such kind of dimension will provide better strain.

This invention provides a resist region between the passivation and the gate insulating layer on the array substrate. When the panel is scribed and spalled, the resist region can provide sufficient strain to protect the gate insulating layer and passivation layer from breaking. Moreover, this invention provides a less activity of the resist region compared to the gate terminal and lead of gate line to prevent gate line from corrosion or oxidization, and has a floating resist region such that there is no electrical connection between the resist region and any circuit of the display panel. Further, formation of the resist region can be combined to the present TFT fabrication process without increasing TFT fabrication cycle time.

Although specific embodiments have been illustrated and described, it will be obvious to those skilled in the art that various modifications may be made without departing from what is intended to be limited solely by the appended claims.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim

1. A device for protecting a gate terminal at stage of scribing and spalling a liquid crystal display panel, wherein said liquid crystal display panel comprising a first substrate with thin film transistor array thereon, and a second substrate thereon with color filter opposite to said thin film transistor array, said gate terminal comprising a gate line, said device comprising:
   a resist region disposed on said gate line and between a passivation layer and a gate insulating layer, said resist region located at a scribing line on margin of the second substrate of said liquid crystal display panel and patterned to protect said gate line from damage during the scribing and spalling stage; and
   wherein material of said resist region is metal.

2. The device according to claim 1, wherein said resist region is a floating region.

3. The device according to claim 1, wherein material of said resist region is the same as source/drain electrodes of each of said thin film transistor.

4. The device according to claim 1, wherein said resist region is formed by a step the same as that for forming said source/drain electrodes comprising:
   providing said thin film transistor array substrate with a gate electrode and said gate line thereon, and said gate insulating layer disposed on said gate electrode, and said gate line;
   forming an island semiconductor layer on said gate insulating layer and over said gate electrode;
   depositing a blanket metal layer on said island semiconductor layer and said gate insulating layer;
   performing a lithographic process to said blanket metal layer by using a reticle with a source pattern and a drain pattern on said gate electrode and a resist region pattern on said gate line; and
   etching said blanket metal layer to form said source/drain electrodes and said resist region.

5. The device according to claim 1, wherein material of said resist region is the same as an island semiconductor layer of said thin film transistor.

6. The device according to claim 5, wherein said resist region is formed by a step the same as that for forming of said island semiconductor layer.

7. The device according to claim 6, wherein said resist region is formed by steps comprising:
   providing said thin film transistor array substrate with a gate electrode and said gate line thereon, said gate insulating layer blanket on said gate electrode, said gate line, and said thin film transistor array substrate;
   depositing a blanket semiconductor layer on said gate insulating layer;
   performing a lithographic process to said semiconductor layer by using a reticle with an island pattern on said gate electrode and a resist region pattern on said gate line; and
   etching said semiconductor layer to form said island semiconductor layer and said resist region.

8. The device according to claim 1, wherein activity of said resist region is less than said gate electrode line.

9. The device according to claim 1, wherein distance between said scribing line and margin of said resist region is more than 50 μm.

10. The device according to claim 9, wherein width of said resist region is larger than said gate terminal and said gate electrode line.

11. The device according to claim 1, wherein said resist region has a width at least as large as the width of the gate line.

12. The device according to claim 1, wherein said resist region has margins disposed along the gate line approximately 50 μm from the scribing line.

* * * * *